(12) United States Patent
Chen et al.

(10) Patent No.: US 12,033,873 B2
(45) Date of Patent: Jul. 9, 2024

(54) WAFER COOLING SYSTEM

(71) Applicant: Taiwan Semconductor Manufacturing Co., Ltd., Hsinchu (TW)

(72) Inventors: Otto Chen, Tainan (TW); Chia-Chih Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/148,787

(22) Filed: Dec. 30, 2022

(65) Prior Publication Data

US 2023/0139777 A1    May 4, 2023

Related U.S. Application Data

(60) Continuation of application No. 17/125,191, filed on Dec. 17, 2020, now Pat. No. 11,569,099, which is a division of application No. 15/719,027, filed on Sep. 28, 2017, now Pat. No. 10,872,789.

(51) Int. Cl.
| | |
|---|---|
| *F25B 21/00* | (2006.01) |
| *F25B 21/04* | (2006.01) |
| *H01L 21/67* | (2006.01) |
| *H01L 21/687* | (2006.01) |

(52) U.S. Cl.
CPC ........ *H01L 21/67109* (2013.01); *F25B 21/04* (2013.01); *H01L 21/67017* (2013.01); *H01L 21/67103* (2013.01); *H01L 21/67201* (2013.01); *H01L 21/67248* (2013.01); *H01L 21/68771* (2013.01); *H01L 21/67259* (2013.01)

(58) Field of Classification Search
CPC ......... H01L 21/67109; H01L 21/67017; H01L 21/68771; H01L 21/67103; F25B 21/04; F25B 21/02

See application file for complete search history.

(56) References Cited

U.S. PATENT DOCUMENTS

| | | | |
|---|---|---|---|
| 4,110,092 A | 8/1978 | Kunioka | |
| 8,600,543 B2 * | 12/2013 | Takechi | ............ H01L 21/67109 700/121 |
| 2001/0038988 A1 * | 11/2001 | Oda | ......................... F27D 9/00 432/5 |
| 2002/0005168 A1 * | 1/2002 | Kraus | ............... H01L 21/67184 118/715 |
| 2005/0150601 A1 * | 7/2005 | Srivastava | ........ H01L 21/67115 156/345.33 |
| 2008/0087218 A1 | 4/2008 | Shimada | |

(Continued)

*Primary Examiner* — Brian M King
(74) *Attorney, Agent, or Firm* — Sterne, Kessler, Goldstein & Fox P.L.L.C.

(57) ABSTRACT

The present disclosure describes a wafer cooling/heating system that includes a load-lock and a thermo module. The load-lock uses a level stream design to improve temperature uniformity across one or more wafers during a cooling/heating process. The load-lock can include (i) a wafer holder configured to receive wafers at a front side of the load-lock; (ii) a gas diffuser with one or more nozzles along a back side of the load-lock, a side surface of the load-lock, or a combination thereof; and (iii) one or more exhaust lines. Further, the thermo module can be configured to control a temperature of a gas provided to the load-lock.

20 Claims, 9 Drawing Sheets

(56) References Cited

U.S. PATENT DOCUMENTS

| | | | |
|---|---|---|---|
| 2012/0043062 A1* | 2/2012 | Tada | H01L 21/67109 |
| | | | 165/185 |
| 2016/0118279 A1* | 4/2016 | Iyer | H01L 21/67772 |
| | | | 118/715 |
| 2017/0025293 A1 | 1/2017 | Jung | |
| 2017/0027053 A1* | 1/2017 | Moczygemba | H05K 1/0203 |
| 2017/0372930 A1* | 12/2017 | Schober | H01L 21/67383 |
| 2018/0040502 A1* | 2/2018 | Kon | H01L 21/67115 |

* cited by examiner

WAFER COOLING SYSTEM

CROSS-REFERENCE TO RELATED APPLICATION

This application is a continuation of U.S. patent application Ser. No. 17/125,191, titled "Wafer Cooling System," filed Dec. 17, 2020, which is a divisional of U.S. patent application Ser. No. 15/719,027, titled "Wafer Cooling System," filed Sep. 28, 2017, each of which is incorporated by reference in its entirety.

BACKGROUND

In semiconductor manufacturing, many processes (e.g., depositions, implants, anneals, etc.) are performed at elevated temperatures (e.g., above 150° C.) or at temperatures below room temperature (e.g., 24° C.). Processed wafers may need to be cooled (or heated) before returning to a wafer carrier outside a processing cluster tool or prior to further processing.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
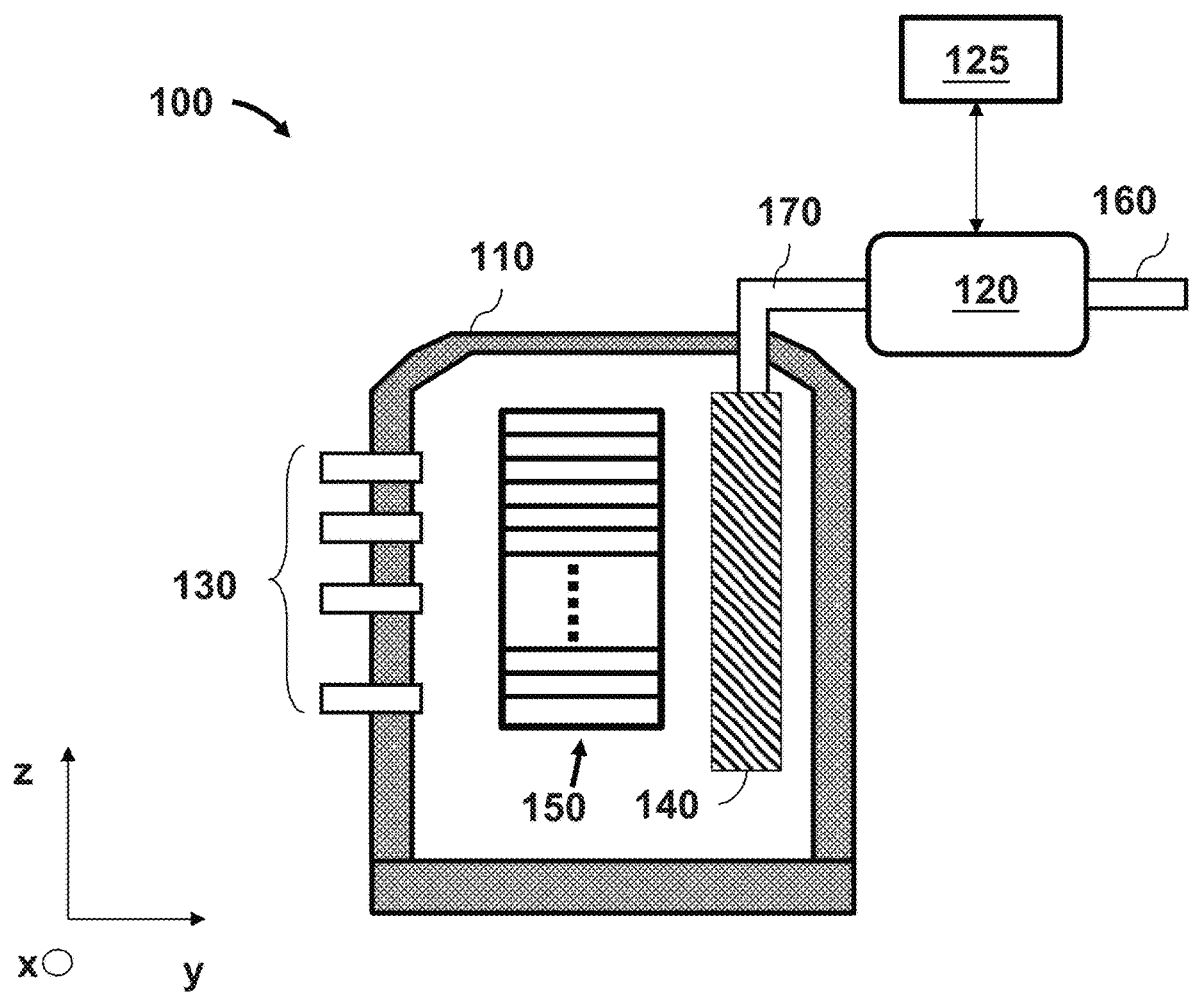
FIG. 1 is a cross-sectional view of an exemplary wafer cooling/heating system that includes a load-lock and a thermo module, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor manufacturing, many processes (e.g., depositions, implants, anneals, etc.) are performed at elevated temperatures (e.g., above 150° C.) or at temperatures below room temperature (e.g., 24° C.). Therefore, wafers may need to be cooled (or heated) before returning to a wafer carrier outside a processing cluster tool or before entering a processing reactor for additional processing. A cool-down or a warm-up process may take hundreds or thousands of seconds and may depend on an initial wafer temperature and an "efficiency" of the cooling/heating system—e.g., cooling or heating rate. Wafer cooling or heating can take place in a part of a cluster tool that is referred to as "a load-lock." Wafer cooling or heating can be performed via thermal conduction between a gas, which can flow constantly into the load-lock, and the wafer(s). A diffuser can be used to distribute the gas in the load-lock. The diffuser can be, for example, located at the top of the load-lock so the gas can flow from top to bottom in a downstream fashion. An exhaust line located, for example, at the bottom of the load-lock can remove the gas from the load-lock. The downstream design, however, can result in a temperature gradient of several degrees Celsius (e.g., up to 4° C. or more) across a batch (or load) of wafers as they cool down or heat up. The resulting temperature gradient can impact the load-lock's cooling or heating efficiency. Other factors that may impact the cooling or heating efficiency of the load-lock can be load-lock pressure, load-lock volume, cooling/heating gas temperature, flow rate of the heating/cooling gas, etc.

The efficiency of the load-lock can be measured in terms of wafer throughput, such as how many wafers the load-lock can "process" (e.g., cool-down or heat-up) per hour. The wafer throughput of the load-lock can also impact an overall wafer throughput of a processing tool (cycle time). If the temperature gradient between the wafers within a batch of wafers is high (e.g., 6° C. or 7° C.), the cooling or heat-up time may increase until all wafers are cooled down or warmed up to an appropriate temperature.

This disclosure is directed to a wafer cooling/heating system that includes a load-lock and a thermo module. The load-lock utilizes a level stream design that can improve wafer temperature uniformity during the cooling/heating process and can accelerate wafer cooling or heating compared to a load-lock with a downstream design. According to some embodiments, the level stream cooling/heating system can reduce the wafer cooling/heating time by about 82% and improve the wafer throughput by about 45%. The level stream design includes a diffuser, which is positioned on a side surface of a load-lock and can flow a gas parallel to the surface of the wafer(s) through multiple nozzles. A series of gas exhaust lines at the wafer level can control a gas removal rate and detect potential nozzle malfunctions. Additionally, the thermo module of the cooling/heating system can provide a wide range of gas temperatures. For example, the temperature of the gas supplied to the load-lock via the thermo module can range from about −50° C. to about 50° C.

FIG. 1 is a cross-sectional view of an exemplary wafer cooling/heating system 100, according to some embodiments. Exemplary wafer cooling/heating system 100 includes a load-lock 110, a thermo module unit 120, and a control module 125. Load-lock 110 can include multiple exhaust lines or exhaust lines 130, a diffuser 140, and a wafer holder 150. A gas from a semiconductor fabrication facility can be delivered to thermo module unit 120 through inlet 160. The gas can be heated or cooled in thermo module unit 120 and subsequently delivered to diffuser 140 via outlet 170.

Wafer cooling/heating system 100 can be, for example, a unit on a processing cluster tool that can receive individual wafers or wafer batches in wafer holder 150. By way of example and not limitation, wafer holder 150 can be configured to hold up to 25 wafers. Wafer cooling/heating system 100 can cool-down/warm-up wafers before releasing them to a wafer carrier outside the cluster tool or before releasing them to the cluster tool for further processing. Wafer cooling/heating system 100 may include additional components. These additional components may or may not be depicted in FIG. 1; however, they are within the spirit and scope of this disclosure. Such components may be additional reactors or modules, robotic arms, controllers, valves, pedestals, internal and external electrical connections to other modules of the cluster tool such as computers, valves, pumps, and the like.

In some embodiments, load-lock 110 can be a chamber with a cubical shape, an orthogonal shape, a cylindrical shape, a polyhedron shape, or any other suitable shape. Load-lock 110 can have one or more side surfaces. Load-lock 110 can also have a front surface with a door valve (or slit valve) used to transfer wafers in and out of load-lock 110. Wafers can be transferred in and out of load-lock 110 via a robotic arm (not shown in FIG. 1) that can be located outside wafer cooling/heating system 100. The robotic arm can be located, for example, in a transfer module, which can be part of the processing cluster tool (not shown in FIG. 1).

Exhaust lines 130 may be located on one or more side surfaces of load-lock 110, according to some embodiments. In some embodiments, exhaust lines 130 may include up to 25 individual lines, where each exhaust line may correspond to a single wafer on wafer holder 150. In some embodiments, each exhaust line is connected, via a respective exhaust valve (not shown in FIG. 1), to an external exhaust pump (not shown in FIG. 1). In some embodiments, a gas flow through each of exhaust lines 130 towards the exhaust pump can be controlled by a respective exhaust valve for exhaust lines 130. By way of example and not limitation, each exhaust valve may adjust its opening from 0 to about 100%. In some embodiments, depending on a "heat load" of load-lock 110 (e.g., a number of wafers and a starting wafer temperature), wafer cooling/heating system 100 may activate one or more exhaust valves and may control the gas flow through each exhaust line (e.g., the opening position of each exhaust valve) for optimal cooling or heating performance. In some embodiments, exhaust lines 130 may detect a clogged nozzle on diffuser 140. For example, a flow controller connected to each exhaust line may be calibrated to anticipate a certain flow for a particular valve position. When that flow is not met, an alarm can notify a user.

Figure 2:
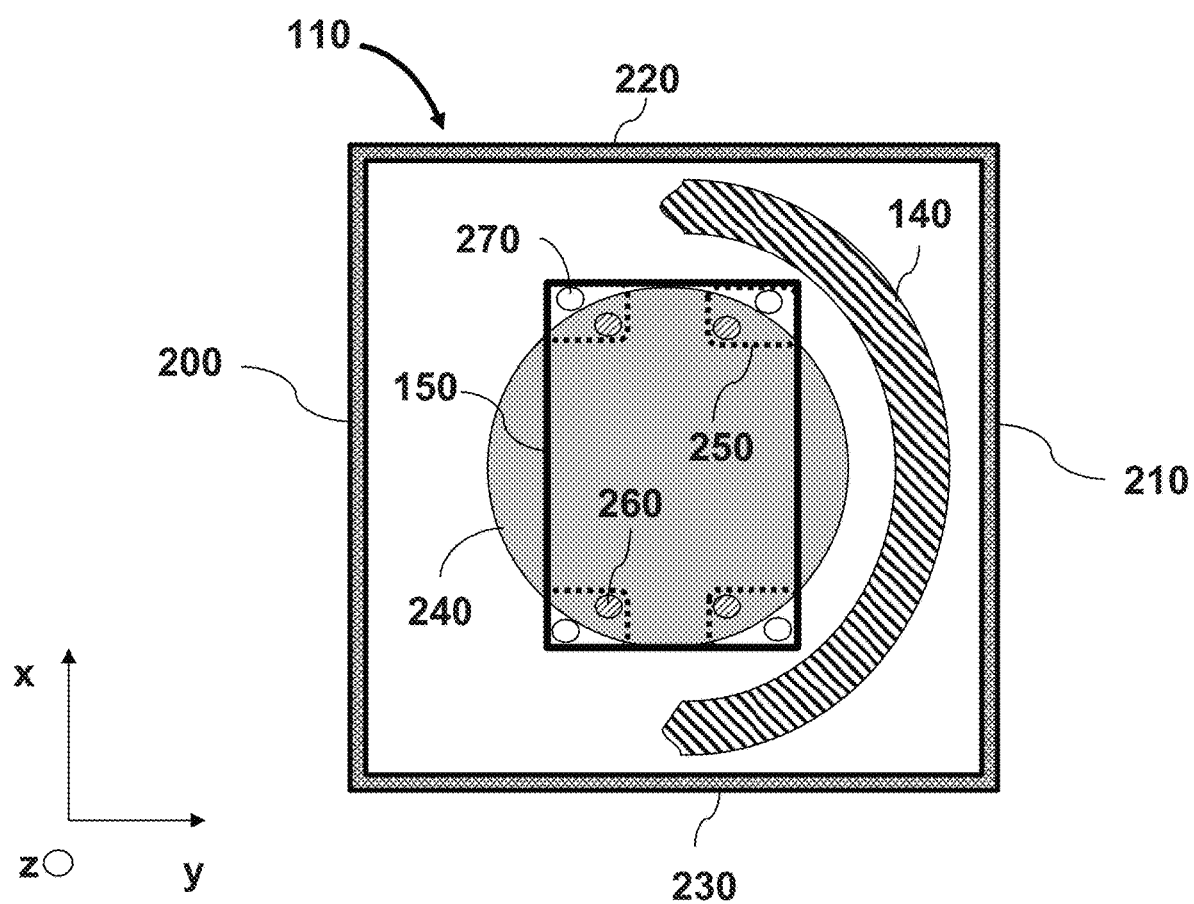
FIG. 2 is a top-view of an exemplary load-lock with an arcuate-shaped diffuser, according to some embodiments.

In some embodiments, diffuser 140 can be located on a back side surface of load-lock 110, a side surface of load-lock 110, or a combination thereof. A back side surface of load-lock 110 can be defined as a surface that is opposite to a front side surface of load-lock 110. By way of example and not limitation, FIG. 2 is a top-view of load-lock 110, according to some embodiments. In this exemplary view, load-lock 110 is a chamber with a front surface 200, a back surface 210, and a pair of side surfaces 220 and 230. In some embodiments, diffuser 140 can have an arcuate shape, which can be any fraction of a cylinder (e.g., semi-cylindrical, ¾ of a cylinder, etc.) as long as diffuser 140 does not obstruct a path of an incoming or outgoing wafer through front surface 200. Based on the above description, diffuser 140 may be located on back side surface 210, side surfaces 220 and 230, or a combination of thereof. Diffuser 140, due to its arcuate shape, can partially surround stacked wafers 240 on wafer holder 150.

In some embodiments, wafer holder 150 can have a rectangular shape as shown in FIG. 2. The rectangular shape of wafer holder 150 in FIG. 2 is exemplary and is not intended to be limiting. Therefore, additional shapes are within the spirit and scope of this disclosure. For example, wafer holder 150 can have a square shape, a cylindrical shape, or any other shape that fits load-lock 110. In some embodiments, wafer holder 150 can have slots configured to receive respective wafers. By way of example and not limitation, each slot may further include multiple slats 250 (e.g., four opposing slats 250 as shown in FIG. 2), which are configured to hold a single wafer in a horizontal position. Each slat 250 may have a temperature sensor 260 and a flow rate sensor 270 thereon. By way of example and not limitation, temperature sensor 260 may be in contact with a wafer's back surface (e.g., a wafer surface without semiconductor elements formed thereon), while flow rate sensors 270 may not be in contact the wafer. In some embodiments, each temperature sensor 260 on each slat 250 can provide a wafer temperature reading so that a four-corner temperature map for each wafer can be obtained. By way of example and not limitation, temperature sensors 260 may transmit a radio frequency (RF) signal that can contain a temperature reading to an external control unit (e.g., control module 125 of FIG. 1). In some embodiments, temperature sensor 260 can read wafer temperatures within a range of about −150° C. to about 500° C. By way of example and not limitation, temperature sensor 260 can be a thermocouple that produces a temperature-dependent voltage or a resistance temperature detector (e.g., a thermistor).

Similarly, flow rate sensors 270 can provide a flow rate reading for a gas flown through diffuser 140 at their respective locations. In some embodiments, each flow rate sensor 270 may provide a gas flow rate reading so that a four-corner gas flow rate map for each wafer can be obtained. In some embodiments, flow rate sensors 270 may transmit a radio frequency (RF) signal that can contain a gas flow rate reading to an external control unit, such as control module 125 of FIG. 1. In some embodiments, flow rate sensors 270 may be able to read a range of gas flow rates (e.g., between about 2 ml/min to about 200 ml/min and between about 4 l/min to about 350 l/min).

In some embodiments, the temperature and flow rate readings from the flow and temperature sensors 260 and 270, respectively, can be used by control module 125 and other units of cooling/heating system 100 to further optimize the wafer cooling or heating process. For example, as a result of the temperature and flow rate readings, cooling/heating system 100 may increase or decrease the flow of cooling/ heating gas, increase or decrease the gas temperature, activate or deactivate one or more exhaust lines 130, etc. In some embodiments, the temperature and flow rate readings can be used to detect a system malfunction, such as a deactivated exhaust line 130 or a clogged nozzle on diffuser 140.

Figure 3:
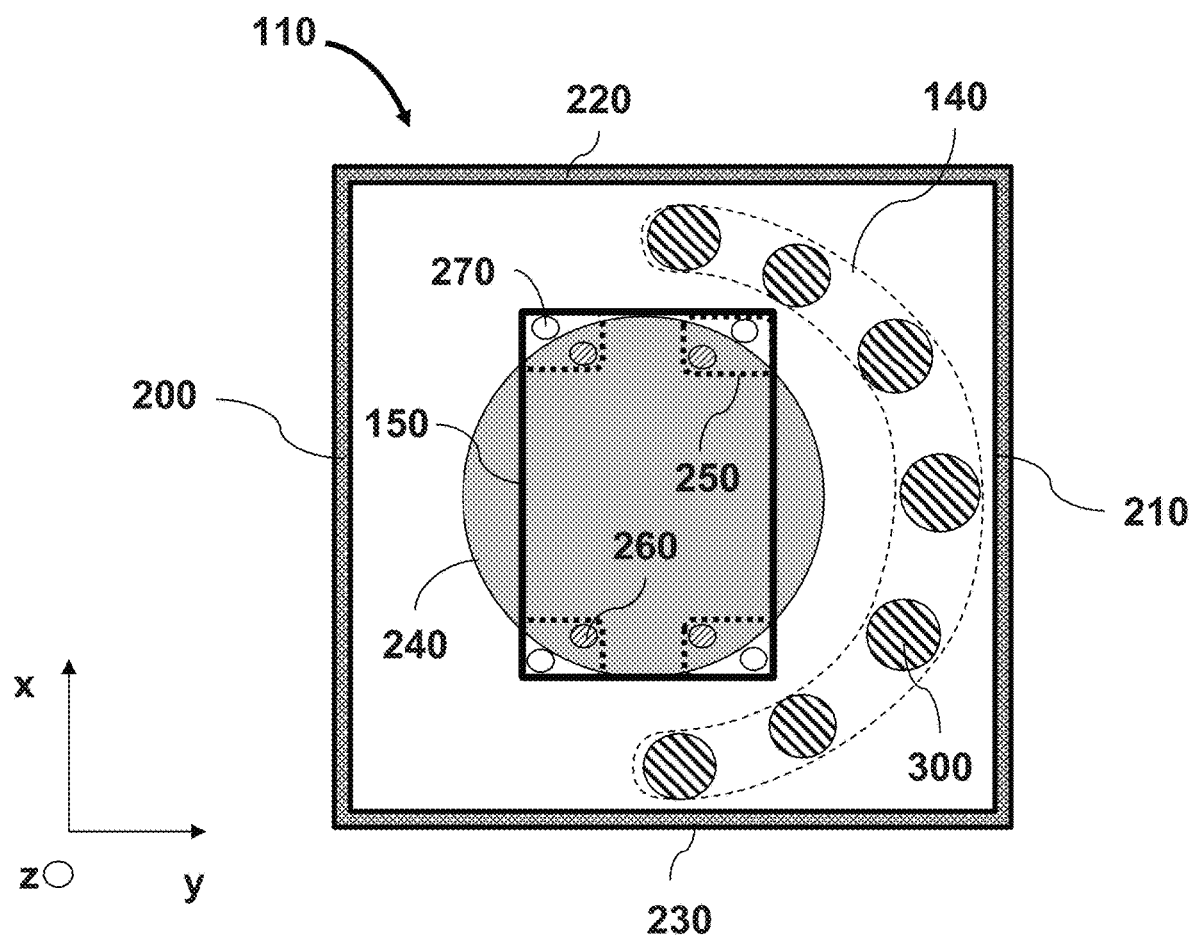
FIG. 3 is a top-view of an exemplary load-lock with diffuser rods in an arcuate configuration, according to some embodiments.

According to some embodiments, diffuser 140 can be made of individual cylindrical, square, rectangular, or polygon diffuser "rods" which can be arranged in a arcuate configuration, such as diffuser rods 300 as shown, for example, in FIG. 3. The aforementioned shapes of diffuser rods 300 are exemplary and not intended to be limiting. Therefore, additional shapes are within the spirit and scope of this disclosure. The arcuate configuration of diffuser rods 300 may not be limited to the number of diffuser rods 300 shown in FIG. 3. Therefore, additional or fewer diffuser rods 300 are possible as long as the diffuser rods 300 do not obstruct the path of an incoming or outgoing wafer via front surface 200 of load-lock 110.

Figure 4:
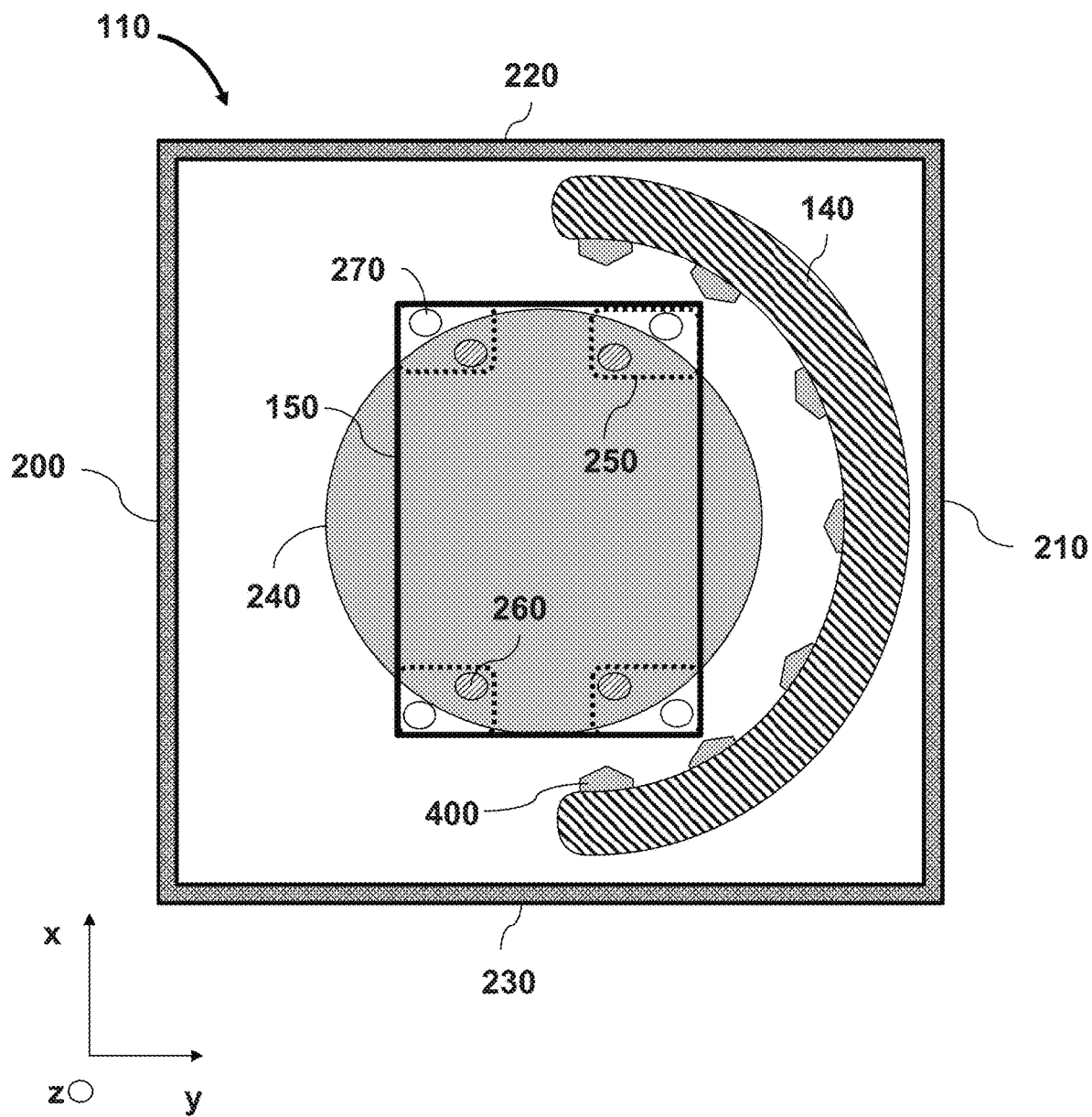
FIG. 4 is a top-view of an exemplary load-lock with an arcuate-shaped diffuser with nozzles, according to some embodiments.
Figure 5:
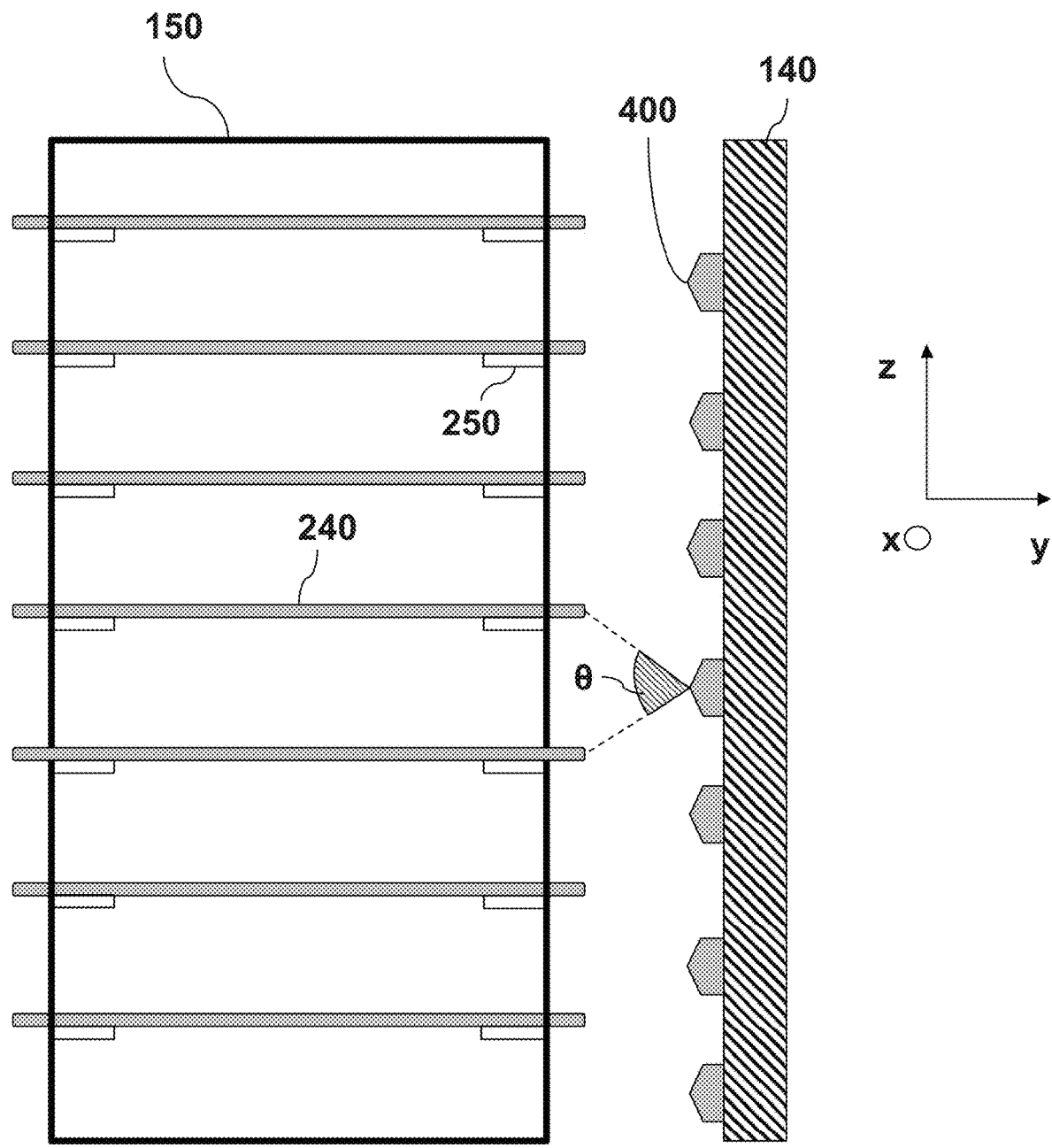
FIG. 5 is a cross-sectional view of an exemplary wafer holder and diffuser with multiple nozzles, according to some embodiments.

As discussed above, diffuser 140 may include multiple nozzles along its surface. FIG. 4 is the diffuser arrangement of FIG. 2 with an exemplary row of nozzles 400 thereon. Nozzles 400 are facing a stack of wafers 240 and may cover an inner surface of diffuser 140 in several possible arrangements. By way of example and not limitation, the arrangement may include a row of nozzles 400 across an x-y plane (according to x-y axes shown FIG. 4) that can be repeated along a z-direction, where the z-direction can be perpendicular to the x-y plane. Further, each row of nozzles 400 along the x-y plane may be aligned in the z-direction to a space between two neighboring wafers 240 as shown in FIG. 5. FIG. 5 can be, for example, a cross sectional view of FIG. 4 along the z-axis (e.g., perpendicular to x-y plane of FIG. 4). As discussed above, alternative arrangements of nozzles 400 on diffuser 140 can be possible depending on, for example, the chamber geometry (e.g., rectangular, orthogonal, cylindrical, etc.), the volume of load-lock 110, the flow kinetics of the gas, etc.

In FIG. 5, a gas spray angle θ of each nozzle 400 may be controlled by cooling/heating system 100 depending, for example, on the number of wafers 240 in wafer holder 150, the space between wafers 240 in wafer holder 150, the volume of load-lock 110, or a combination thereof. According to some embodiments, gas flow angle θ for each nozzle 400, may range from 0° (narrow) to about 90° (wide), such as a range between 0.01° and 89.9°. As a result, the flow for each nozzle 400 may be directional (e.g., about 0.01°) or wide (e.g., about 89.9°). In some embodiments, an output gas pressure of each nozzle 400 can also be controlled by cooling/heating system 100. For example, and according to some embodiments, the output gas pressure for each nozzle 400 can range from about 0.1 psi to about 100 psi. In some embodiments, nozzles 400 can be activated individually or as a group. In addition, each nozzle may have a different spray angle θ. For example, if a slot is not occupied by a wafer, its corresponding nozzle(s) may have a wider spray angle θ compared to a nozzle located between slots with wafers. Alternatively, each nozzle may have a similar or the same spray angle θ.

In some embodiments, load-lock 110 can also include pressure sensors (not shown in the figures), which can provide pressure readings from about $1\times10^{-9}$ Torr to about 1000 Torr. By way of example and not limitation, the pressure sensors can be located at the corners of load-lock 110, if load-lock 110 has a cubical or a rectangular shape. Alternatively, the pressure sensors can be located in the top and bottom perimeter of load-lock 110, if load-lock 110 has, for example, a cylindrical shape. The number or arrangement of pressure sensors disclosed herein is exemplary and is not intended to be limiting. Therefore, additional or fewer pressure sensors and their respective location in load-lock 110 are possible. In some embodiments, the pressure sensors may provide feedback to cooling/heating system 100 and based on the feedback adjustments can be made to gas flow angle θ, output pressure of nozzles 400, etc.

In some embodiments, the gas used to cool or heat the wafers in load-lock 110 is a noble or an inert gas. The noble or inert gas can prevent chemical reactions between, for example, the gas and wafers 240. Chemical reactions between the gas and wafers 240 can inadvertently alter the physical, chemical, and/or electrical properties of structures formed on wafers 240. In some embodiments, the gas can be nitrogen ($N_2$). By way of example and not limitation, other gases include helium (He), argon (Ar), neon (Ne), xenon (Xe), krypton (Kr), and radon (Rn). In referring to FIG. 1, the gas can be delivered to thermo module unit 120 from an external source (e.g., a source located elsewhere in a semiconductor fabrication facility). According to some embodiments, the gas delivered from the external source can be at room temperature (e.g., about 24° C.) and at a pressure of about 20 psi. According to some embodiments, thermo module unit 120 can be configured to adjust the temperature of the gas delivered to a diffuser 140, via outlet 170, to a range between about −50° C. to about 50° C. In some embodiments, control module 125 may control the operations of thermo module unit 120. Control module 125 may connect to thermo module unit 120 via a wire or wireless communication and may be able to receive temperature readings from multiple sources and multiple locations of wafer cooling/heating system 100 (e.g., inlet 160, outlet 170, temperature sensors 270, etc.).

According to some embodiments, thermo module unit 120 includes a thermoelectric module. The thermoelectric module is a semiconductor-based electronic component that functions as a heat pump. By applying a direct current (DC) voltage (e.g., 24 Volts) to a thermoelectric module, heat can be moved through the module from one side to the other. As a result, one side of the module can be cooled while an opposite side of the module can be heated. If a change in the polarity (plus and minus) of the applied DC voltage occurs, the cooling and heating sides of the module can be reversed. Consequently, a gas can be cooled when it is exposed to a cold side of the thermoelectric module or heated when it is exposed to the hot side of the thermoelectric module. For example, in some embodiments, cooling or heating of a gas is achieved by channeling the incoming gas over the cold or hot side of the thermoelectric module. In other embodiments, the gas can be exposed to a single side of the thermoelectric module and the polarity of the applied DC voltage can be changed to switch from cooling to heating. In some embodiments, control module 125 can control the DC voltage applied to thermo module unit 120.

Figure 6:
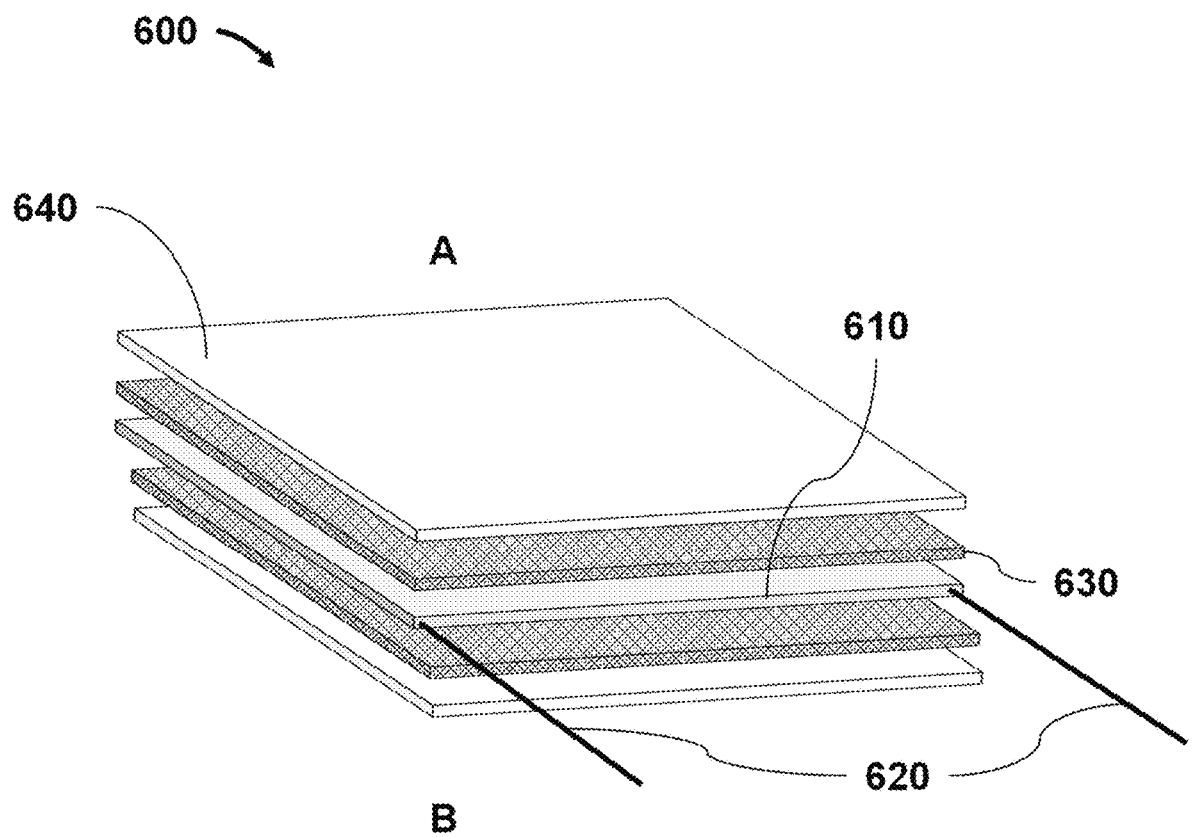
FIG. 6 is a cross-sectional view of an exemplary thermoelectric module with a semiconductor material between a pair of copper sheets and a pair of ceramic plates, according to some embodiments.

Referring to FIG. 6, an exemplary thermoelectric module 600 is depicted. Thermoelectric module 600 can include semiconductor material 610 that is electrically connected to a DC power supply (not shown) through electrical connections 620. Semiconductor material 610 can include multiple PN junctions electrically connected in series. By way of example and not limitation, semiconductor material 610 can include P- and N-doped bismuth telluride ($Bi_2Te_3$). The electrical connections of semiconductor material 610 can be made such that a top side A of thermoelectric module 600 is the cold side and a bottom side B is the hot side, or vice versa. For example purposes, top side A can be the cold side and bottom side B can be the hot side of semiconductor material 610. Semiconductor material 610 can be disposed between two copper sheets 630. Copper sheets 630 can improve the heat transfer from each side of semiconductor material 610 to the surrounding layers. The aforementioned elements (semiconductor material 610 and copper sheets 630), along with their electrical interconnects, can be enclosed between two ceramic plates 640, which can mechanically hold the overall structure together. In some embodiments, ceramic plates 640 can function as external mounting surfaces.

According to some embodiments, thermoelectric module 600 can include additional layers, which are not depicted in FIG. 6. For example, thermoelectric module 600 may include an adhesion medium (e.g., a glue layer) between ceramic plates 640 and copper sheets 630, and an alloy material (e.g., solder) between semiconductor material 610 and copper sheets 630 or between copper sheets 630 and ceramic plates 640.

In some embodiments, a finned heat sink may be attached on ceramic plate 640 located on the hot side, B, of thermoelectric module 600. In some embodiments, finned heat sinks may be attached on both ceramic plates 640. Finned heat sinks can have a greater surface area than a flat surface and can therefore accelerate the heat exchange process between the gas and thermoelectric module 600. By way of example and not limitation, the heat sink can be made of metals with high thermal conductivity, such as aluminum (Al) or copper (Cu). In some embodiments, the gas is forced through the heat sink so that it can be cooled or heated.

Figure 7:
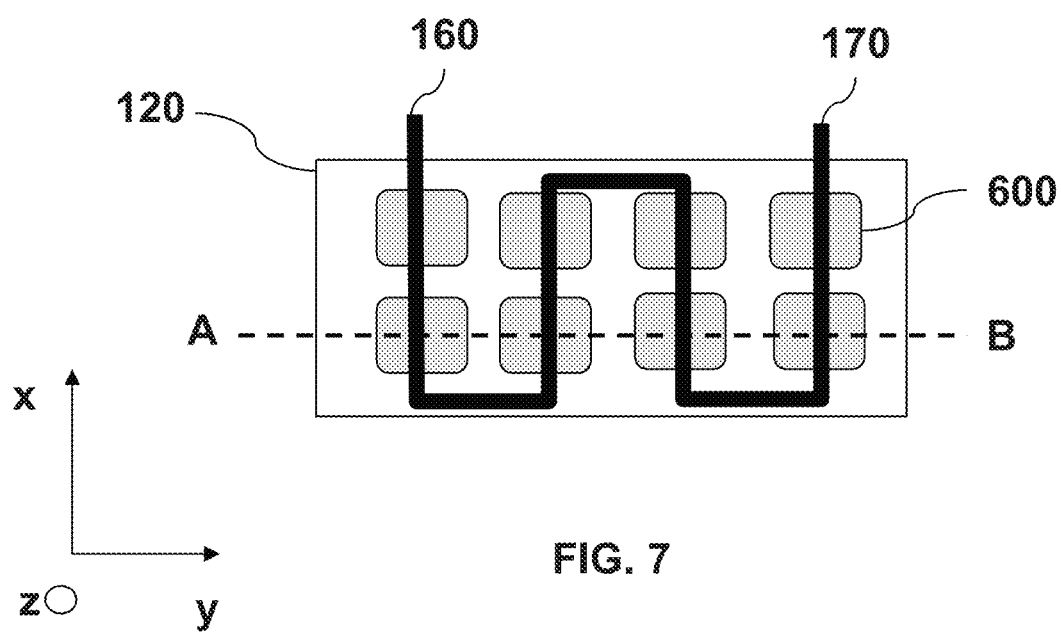
FIG. 7 is a top-view of an exemplary arrangement of thermoelectric modules in a thermo module, according to some embodiments.
Figure 8:
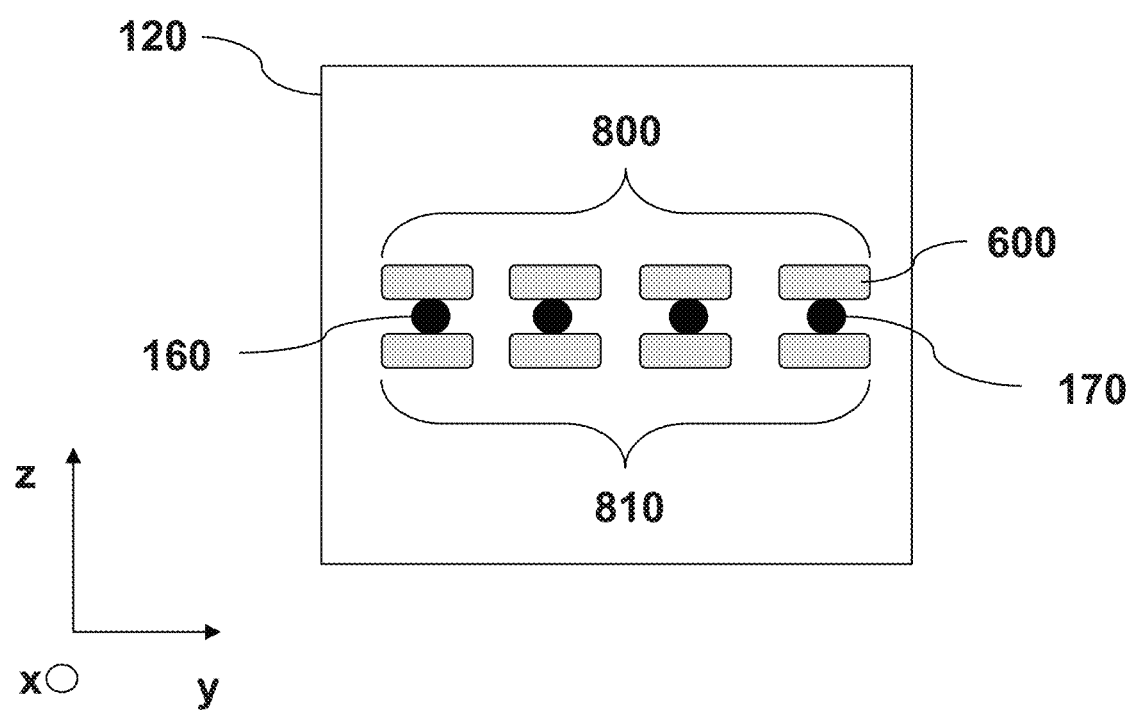
FIG. 8 is a cross-sectional view of an exemplary arrangement of thermoelectric modules in a thermo module where the thermoelectric modules are stacked with a gas flowing between them, according to some embodiments.

In some embodiments, a thermo module unit 120 may include more than one thermoelectric module 600. For example, in some embodiments, a thermo module unit 120 may include multiple thermoelectric modules 600 in a variety of arrangements. By way of example and not limitation, FIG. 7 shows an exemplary arrangement of thermoelectric modules 600 in thermo module unit 120. A gas is delivered from an external source (e.g., a source located elsewhere in a fabrication facility) through inlet 160 inside thermo module unit 120. The gas passes through a top or a bottom surface of the thermoelectric modules before it exits thermo module unit 120 via outlet 170. The arrangement of thermoelectric modules 600 described in FIG. 7 is exemplary and should not be considered limiting. Additional arrangements of thermoelectric modules 600 are possible with a larger or smaller number of thermoelectric modules 600. Additionally, the path of the gas inside thermo module unit 120 is not limited to the depiction of FIG. 7. Therefore, additional arrangements, gas paths inside thermo module unit 120, and number of thermoelectric modules 600 are within the spirit and scope of this disclosure. In some embodiments, arrangements of thermoelectric modules 600 can be stacked on top of each other with the gas flowing between them. For example, an additional arrangement of thermoelectric modules 600 can be stacked over the arrangement of thermoelectric modules 600 of FIG. 7 so that the gas can travel between them. By way of example and not limitation, FIG. 8, which is a cross-sectional view of thermo module unit 120 across line AB, shows such an exemplary stacked configuration, where the path of the gas is in the x-direction and between an upper arrangement 800 of thermoelectric modules 600 and a lower arrangement 810 of thermoelectric modules 600. In the example of FIG. 8, the gas enters thermo module unit 120 through inlet 160 and exits from outlet 170.

Figure 9:
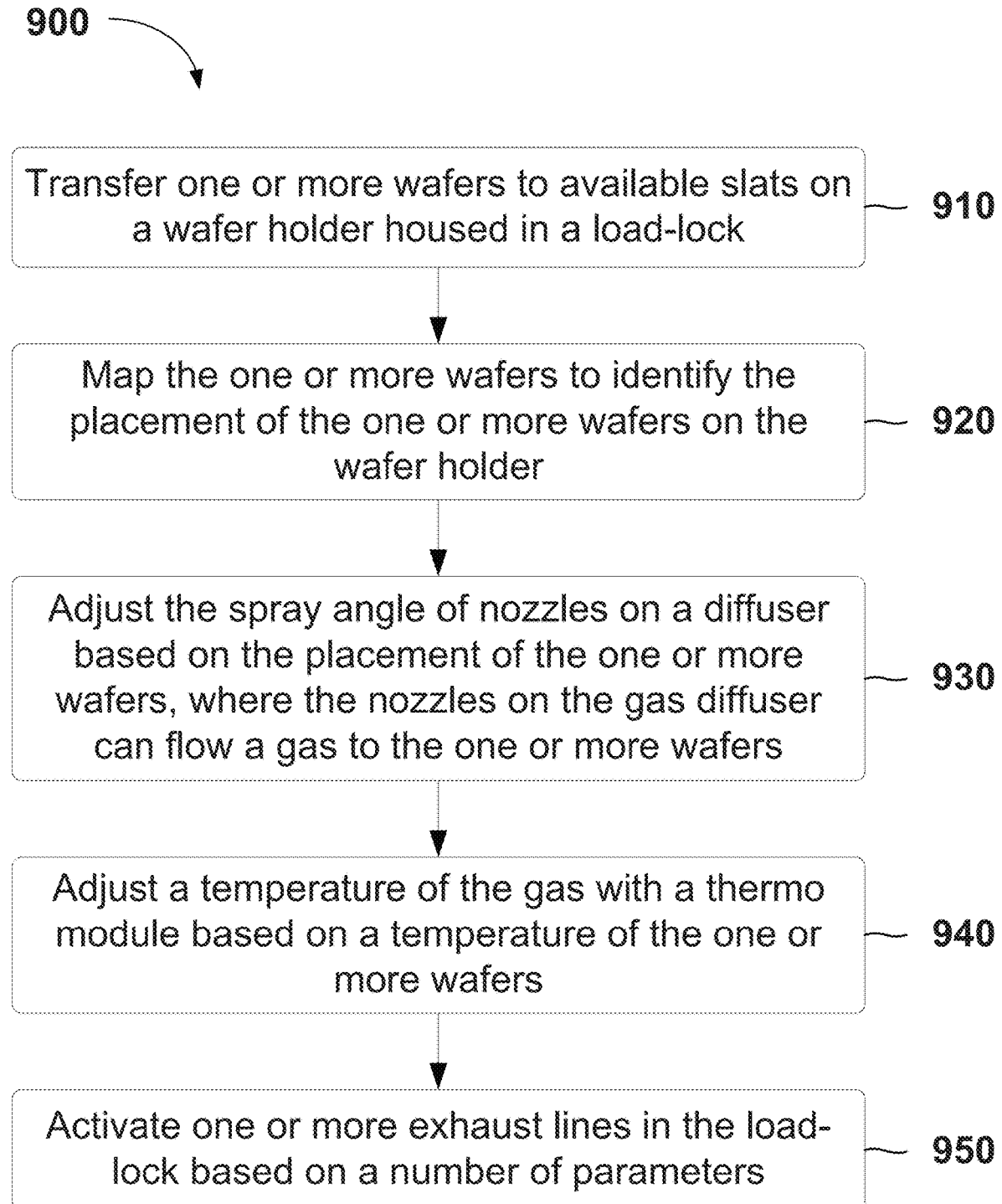
FIG. 9 is an exemplary method for cooling or heating one or more wafers, according to some embodiments.

FIG. 9 is an exemplary method 900 for cooling or heating one or more wafers, according to some embodiments. This disclosure is not limited to this operational description. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 9. In some implementations, one or more other operations may be performed in addition to or in place of the presently described operations. For illustrative purposes, method 900 is described with reference to the embodiments of FIGS. 1-8. However, method 900 is not limited to these embodiments.

Exemplary method 900 starts with operation 910, where one or more wafers are transferred to available slats 250 on a wafer holder 150 in load-lock 110. According to some embodiments, load-lock 110 is housed in cooling/heating system 100. Each wafer is positioned in a respective slot of wafer holder 150 so that it rests on slats 250. Temperature sensors 260 on each slat 250 make contact to the back side of the wafer.

In operation 920, the one or more wafers are "mapped" so that the slot position of the one or more wafers is identified and stored in a memory of a computer system that can be accessed by control module 125. In some embodiments, the number of wafers can range from 1 to 25. In some embodiments, the wafers may or may not occupy consecutive slots.

In operation 930, cooling/heating system 100 may adjust the spray angle θ of nozzles 400 on diffuser 140. In some embodiments, the spray angle adjustment can be based on the slot position of the one or more wafers on wafer holder 150 and the spacing between neighboring wafers, so that nozzles 400 on diffuser 140 can flow the gas parallel to the one or more wafers. In some embodiments, spray angle θ of nozzles 400 can be controlled independently for each nozzle. By way of example and not limitation, if two consecutive slots are occupied, the spray angle θ of the corresponding nozzle can be narrow (e.g., 0.01°). In another example, where two consecutive slots are not occupied, the spray angle θ of the corresponding nozzle can be wide (e.g., 89.9°). According to some embodiments, nozzles 400 can be positioned on diffuser 140 between the slots of wafer holder 150. According to some embodiments, if some slots are not occupied by a wafer, the corresponding nozzles may be turned off by cooling/heating system 100.

In operation 940, based on an initial temperature of the one or more wafers in load-lock 100, thermo module unit 120 can adjust the temperature of an incoming gas prior to its delivery to load-lock 110 through outlet 170. In some embodiments, the gas is delivered to thermo module unit 120 through inlet 160 from an external source. In some embodiments, the gas can be $N_2$. By way of example and not limitation, other gases that can be used include He, Ar, Ne, Xe, Kr, and Rn. According to some embodiments, the gas delivered from the external source can be at room temperature (e.g., about 24° C.) and at a pressure of about 20 psi. According to some embodiments, thermo module unit 120 can be configured to adjust the temperature of the gas delivered to a diffuser 140, via outlet 170, to a range between about −5° C. to about 50° C. In some embodiments, control module 125 can control operations of thermo module unit 120. Control module 125 may connect to thermo module unit 120 via a wire or wireless communication and may be able to receive temperature readings from multiple sources and multiple locations of cooling/heating system 100 (e.g., inlet 160, outlet 170, temperature sensors 270, etc.).

According to some embodiments, thermo module unit 120 includes a thermoelectric module, which is a semiconductor-based electronic component that functions as a heat pump. By applying a DC voltage (e.g., 24 Volts) to a thermoelectric module, heat can be moved through the module from one side to the other. As a result, one side of the module can be cooled while an opposite side of the module can be heated. Consequently, a gas can be cooled when it is exposed to a cold side of the thermoelectric module or heated when it is exposed to the hot side of the thermoelectric module. For example, in some embodiments, cooling or heating of a gas is achieved by channeling the incoming gas over the cold or hot side of the thermoelectric module. In other embodiments, the gas can be exposed to a single side of the thermoelectric module and the polarity of the applied DC voltage can be changed to switch from cooling to heating. In some embodiments, control module 125 can control the DC voltage applied to thermo module unit 120.

In operation 950, one or more exhaust lines 130 of load-lock 110 can be activated to remove the gas from load-lock 110 once it has flown through the one or more wafers. Exhaust lines 130 may be located on one or more side surfaces of load-lock 110, according to some embodiments. In some embodiments, exhaust lines 130 may include up to 25 individual lines, where each exhaust line may correspond to a single wafer. In some embodiments, each exhaust line can be connected, via a respective exhaust valve, to an external exhaust pump. In some embodiments, the gas flow through each of exhaust lines 130 towards the exhaust pump can be controlled by its respective exhaust valve. By way of example and not limitation, each exhaust valve may change its opening cross section from 0 (e.g., fully closed position) to about 100% (e.g., fully open open). According to some embodiments, cooling/heating system 100 may determine which exhaust valves may be activated depending on a number of parameters such as: (i) the number of wafers in load-lock 110 and each of the wafer's slot position; (ii) the spray angle θ of each nozzle; (iii) the flow rate of the gas through the nozzles; (iv) the temperature of the wafers; and (v) the temperature of the gas. In some embodiments, exhaust lines 130 may be used as a troubleshooting tool to detect a clogged nozzle on diffuser 140.

This disclosure is directed to a wafer cooling/heating system that includes a load-lock and a thermo module. The load-lock uses a level stream design to improve temperature uniformity across a batch of wafers during a cooling/heating process. In this level stream design, a diffuser is placed on a side surface of a load-lock and can flow a gas in a direction parallel to the wafer's surface through a series of nozzles. The gas spray angle of the nozzles can be adjusted between 0.01° to about 89.9°. Exhaust lines at the wafer level can control the gas removal rate and detect any nozzle malfunctions. A number of flow and temperature sensors on the wafer holder of the load-lock provide temperature and gas flow information for each wafer. Additionally, the thermo module of the cooling/heating system utilizes a series of thermoelectric modules in a variety of configurations to effectively cool or heat the incoming gas. According to some embodiments, the thermo module of the cooling/heating system can provide a wide range of gas temperatures. For example, the temperature of the gas supplied to the load-lock can range from about −50° C. to about 50° C.

In some embodiments, a wafer cooling system includes (i) a load-lock and (ii) a thermo module configured to control a temperature of a gas provided to the load-lock. Further, the load-lock includes (i) a wafer holder configured to receive wafers at a front side of the load-lock; (ii) a gas diffuser with one or more nozzles along a back side of the load-lock, a side surface of the load-lock, or a combination thereof; and (iii) one or more exhaust lines.

In some embodiments, a wafer cooling system includes a load-lock and a thermo module configured to provide a gas to the load-lock, where the thermo module comprises a semiconductor material with top and bottom surfaces configured to be heated or cooled to different temperatures. The load-lock further includes: (i) a wafer holder configured to receive wafers at a front side of the load-lock; (ii) a gas diffuser along a back side of the load-lock, a side surface of the load-lock, or a combination thereof, where the gas diffuser comprises one or more diffuser rods with one or more nozzles thereon; (iii) and one or more exhaust lines along the side surface of the load-lock, the back side of the load-lock, or a combination thereof.

In some embodiments, a method of cooling wafers includes transferring one or more wafers to slats on a wafer holder that is housed in a load-lock. Adjusting a spray angle for one or more nozzles of a gas diffuser that is located in the load-lock, where the one or more nozzles provides a gas in a direction parallel to the one or more wafers. Adjusting a temperature of the gas with a thermo module, and activating one or more exhaust lines in the load-lock based on at least the spray angle of the one or more nozzles.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a wafer holder comprising first and second wafer slots configured to hold wafers;
   a gas diffuser comprising:
      diffuser rods, and
      a two-dimensional (2D) array of nozzles arranged in a semi-circular configuration around the wafer holder, wherein at least one row of nozzles from the 2D array of nozzles is aligned with a space between the first and second wafer slots; and
   a semiconductor device configured to control a temperature of a gas supplied to the gas diffuser.

2. The system of claim 1, wherein the at least one row of nozzles is configured to dispense gas on the first and second wafer slots.

3. The system of claim 1, wherein each of the diffuser rods comprises at least one column of nozzles from the 2D array of nozzles.

4. The system of claim 1, wherein the diffuser rods are arranged in the semi-circular configuration around the wafer holder.

5. The system of claim 1, wherein each of the first and second wafer slots comprises a slat; and
wherein the slats comprise temperature sensors and gas flow rate sensors.

6. The system of claim 5, wherein the semiconductor device is configured to control the temperature of the gas based on wafer temperatures measured by the temperature sensors.

7. The system of claim 5, wherein each of the temperature sensors comprises a thermocouple.

8. The system of claim 1, wherein the semiconductor device comprises:
a pair of copper sheets; and
a semiconductor layer disposed between the pair of copper sheets.

9. The system of claim 1, wherein the semiconductor device comprises:
a pair of ceramic plates; and
a semiconductor layer disposed between the pair of ceramic plates.

10. The system of claim 1, wherein the semiconductor device is configured to modulate the temperature of the gas between about −50° C. and about 50° C.

11. A system, comprising:
a wafer holder comprising vertically-stacked wafer slots configured to hold wafers;
an arcuate-shaped gas diffuser comprising vertically-stacked rows of nozzles disposed around the wafer holder, wherein at least one of the vertically-stacked rows of nozzles is aligned with a space between the vertically-stacked wafer slots; and
a thermoelectric device, coupled to the arcuate-shaped gas diffuser, comprising:
a pair of ceramic plates; and
a semiconductor layer disposed between the pair of ceramic plates.

12. The system of claim 11, further comprising temperature sensors configured to provide wafer temperatures to the thermoelectric device.

13. The system of claim 11, wherein the thermoelectric device is configured to regulate a temperature of a gas dispensed on the vertically-stacked wafer slots.

14. The system of claim 11, wherein the semiconductor layer comprises a top surface and a bottom surface; and
wherein the top surface is maintained at a temperature lower than that of the bottom surface.

15. The system of claim 11, wherein each of the vertically-stacked rows of nozzles is configured to dispense a gas on the vertically-stacked wafer slots at an angle between about 0.01° and about 89.9°.

16. The system of claim 11, wherein the wafer holder and the arcuate-shaped gas diffuser are disposed in a load-lock and the thermoelectric device is disposed outside the load-lock.

17. A method, comprising:
loading wafers into wafer slots of a wafer holder;
dispensing a gas between the wafers through diffuser rods comprising a two-dimensional (2D) array of nozzles arranged in a semi-circular pattern around the wafer holder; and
adjusting a temperature of the gas with a semiconductor device while dispensing the gas between the wafers.

18. The method of claim 17, further comprising adjusting spray angles of the 2D array of nozzles based on positions of the wafer slots.

19. The method of claim 17, wherein dispensing the gas comprises flowing the gas parallel to top and bottom surfaces of the wafers.

20. The method of claim 17, wherein adjusting the temperature comprises changing the temperature of the gas based on wafer temperature measured by temperature sensors in the wafer holder.

* * * * *